United States Patent
Vaiyapuri

(10) Patent No.: US 6,541,846 B2
(45) Date of Patent: Apr. 1, 2003

(54) DUAL LOC SEMICONDUCTOR ASSEMBLY EMPLOYING FLOATING LEAD FINGER STRUCTURE

(75) Inventor: Venkateshwaran Vaiyapuri, Singapore (SG)

(73) Assignee: Micron Technology, Inc., Boise, ID (US)

(*) Notice: Subject to any disclaimer, the term of this patent is extended or adjusted under 35 U.S.C. 154(b) by 52 days.

(21) Appl. No.: 09/767,446

(22) Filed: Jan. 23, 2001

(65) Prior Publication Data

US 2002/0027271 A1 Mar. 7, 2002

(30) Foreign Application Priority Data

Sep. 1, 2000 (SG) .................................. 200005005-4

(51) Int. Cl.$^7$ ............................................. H01L 23/495
(52) U.S. Cl. ................... 257/676; 257/666; 257/735; 257/737; 257/777; 257/784; 257/696; 257/723
(58) Field of Search ..................... 257/676, 666, 257/735, 737, 784, 777, 696, 723

(56) References Cited

U.S. PATENT DOCUMENTS

| | | | |
|---|---|---|---|
| 4,862,245 A | 8/1989 | Pashby et al. | |
| 4,916,519 A | 4/1990 | Ward | |
| 5,012,323 A | 4/1991 | Farnworth | |
| 5,291,061 A | 3/1994 | Ball | |
| 5,303,120 A | * 4/1994 | Michii et al. | ............... 361/760 |
| 5,508,565 A | 4/1996 | Hatakeyama et al. | |
| 5,530,292 A | 6/1996 | Waki et al. | |
| 5,585,668 A | 12/1996 | Burns | |
| 5,724,233 A | * 3/1998 | Honda et al. | ............... 361/813 |
| 5,770,480 A | 6/1998 | Ma et al. | |
| 5,789,803 A | 8/1998 | Kinsman | |
| 5,804,874 A | 9/1998 | An et al. | |
| 5,872,398 A | 2/1999 | King et al. | |
| 5,898,220 A | 4/1999 | Ball | |
| 5,952,725 A | 9/1999 | Ball | |
| 6,008,996 A | 12/1999 | Schoenfeld et al. | |
| 6,072,228 A | 6/2000 | Hinkle et al. | |
| 6,252,299 B1 | * 6/2001 | Masuda et al. | ............. 257/686 |

* cited by examiner

Primary Examiner—Albert W. Paladini
Assistant Examiner—Luan Thai
(74) Attorney, Agent, or Firm—TraskBritt

(57) ABSTRACT

A method and apparatus for increasing integrated circuit density in a semiconductor die assembly, and specifically, a dual LOC semiconductor die assembly. A first and a second die are substantially symmetrically back bonded to a die attach site on a opposing sides of a base lead frame. A first and a second offset lead frame, each having a plurality of lead fingers, are then attached to the base lead frame on opposing sides thereof so that their lead fingers respectively extend over the first and second dice in a cantilevered manner. Wire bonds are formed between lead ends of each of the lead fingers to corresponding bond pads on the first and second dice for electrical connection therebetween. The assembly is then encapsulated in a transfer molding process, after which the stacked dual LOC semiconductor assembly is subjected to a trim and form operation.

14 Claims, 6 Drawing Sheets

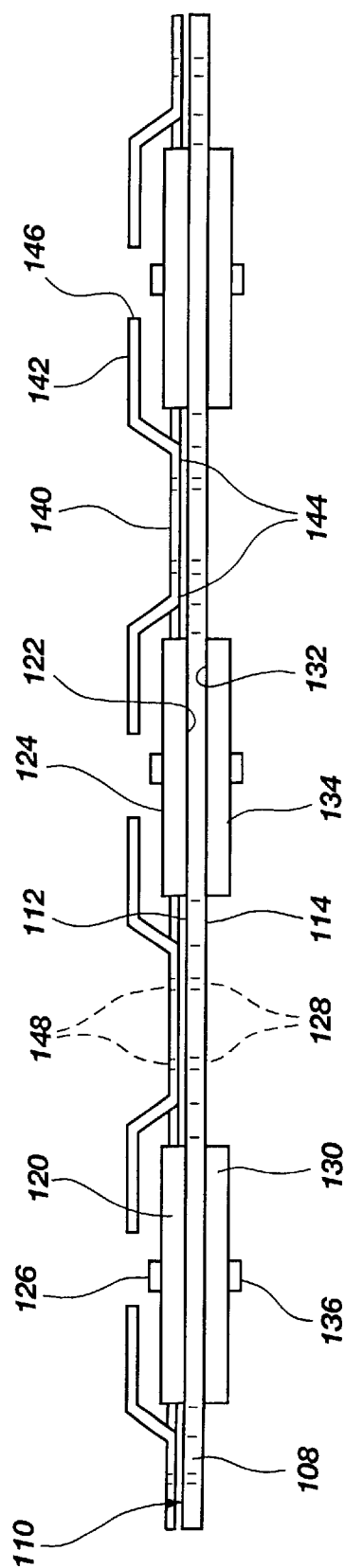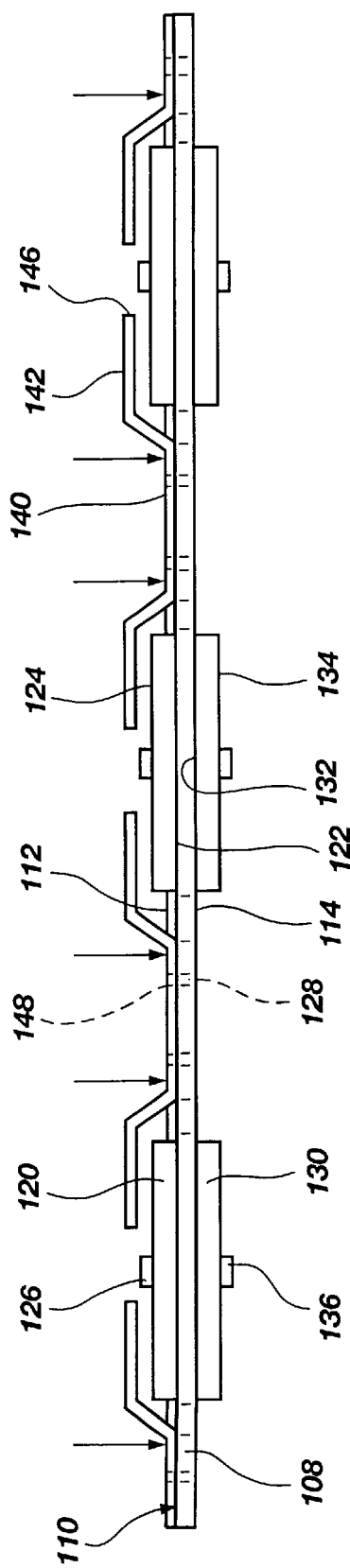

DUAL LOC SEMICONDUCTOR ASSEMBLY EMPLOYING FLOATING LEAD FINGER STRUCTURE

BACKGROUND OF THE INVENTION

1. Field of the Invention

The present invention relates generally to a semiconductor die assembly employing multiple semiconductor dice. More specifically, the present invention relates to a method and apparatus for increasing integrated circuit density by employing dual leads-over-chip (LOC) configured semiconductor dice in a symmetrically configured semiconductor die assembly.

2. State of the Art

High performance, low cost, increased miniaturization of components, and greater packaging density of integrated circuits have long been the goals of the computer industry. Greater integrated circuit density, for a given level of active component and internal conductor density, is conventionally limited by the space available within a packaging envelope and by the surface area, or "real estate", available on a carrier substrate such as a printed circuit board.

For single, conventional lead frame mounted dies, this limitation is a result of the basic design. Conventional lead frame design inherently limits potential single-die package density because the die-attach paddle of the lead frame is usually as large or larger than the die residing on the paddle. The larger the die, the less space (relative to size of the die) that remains around the periphery of the die-attach paddle for bond pads for wire bonding. Furthermore, the inner lead finger ends on a lead frame may provide anchor points for the leads when the leads and the die are encapsulated, as with a filled polymer by transfer molding. These anchor points may be embodied as lateral flanges or bends or kinks in the lead finger. Therefore, as die size is increased in relation to package size, there is a corresponding reduction in the available depth along the sides of a package for encapsulant material to anchor to the lead fingers and provide a robust seal thereabout. Consequently, as the lead fingers are subjected to the normal stresses of trimming, forming and assembly with a carrier substrate such as a printed circuit board, the encapsulant material may crack and destroy the package seal, substantially increasing the probability of premature device failure.

One method of increasing integrated circuit density is to stack a plurality of dice vertically. U.S. Pat. No. 5,012,323, issued Apr. 30, 1991 to Farnworth teaches combining a pair of dice mounted on opposing sides of a lead frame. An upper die is back-bonded to the upper surface of the leads of the lead frame via a first adhesively coated, insulated film layer. The lower die is face-bonded to the lower lead frame die-bonding region via a second, adhesively coated, insulative, film layer. The wire-bonding pads on both upper die and lower die are interconnected with the ends of their associated lead extensions with gold or aluminum wire bonds. The lower die is slightly larger than the upper die so that the lower die bond pads are accessible from above through an aperture in the lead frame such that wire bonds can be made from these bond pads to lead extensions. However, this arrangement has a major disadvantage from a production standpoint, since different size dice are required. Moreover, the lead frame design employed by Farnworth employs long wire bonds as well as extended lead runs between the die and the exterior of the package, and the lead frame configuration is rather complex.

U.S. Pat. No. 5,291,061, issued Mar. 1, 1994 to Ball teaches a multiple stacked die device that contains up to four dies which does not exceed the height of then-current single die packages. The low profile of the device is achieved by close-tolerance stacking which is made possible by a low-loop-profile wire bonding operation and thin-adhesive layers between the dies of the stack. However, Ball secures all of the dice to the same (upper) side of a lead frame, necessarily increasing bond wire length, even if some of the leads of the lead frame are bent upwardly.

U.S. Pat. No. 4,862,245, issued Aug. 29, 1989 to Pashby discloses a "leads over chip" (LOC) configured lead frame, wherein the inner lead finger ends of a dual-in-line package (DIP) configured lead frame extend over and are secured to the upper (active) surface of a semiconductor die through a dielectric layer. Wire bond length is thus shortened by placing the inner lead finger ends in close proximity to a central row of die bond pads. However, the Pashby LOC configuration as disclosed relates to mounting and bonding only a single die.

U.S. Pat. No. 5,804,874, issued Sep. 8, 1998 to An et al. discloses the stacking of two or more identical LOC configured semiconductor dice facing in the same direction. A lower die is adhered by its active surface to leads of a lower lead frame and wire bonded in LOC fashion, after which the active surface of at least one other die is adhered to leads of an upper lead frame in LOC fashion, then adhesively back bonded to the upper surface of the lower lead frame. The leads of the upper lead frame are electrically connected to those of the lower lead frame by thermocompression bonding. The An device, while providing increased circuit density, requires at least two, differently-configured LOC lead frames and wire bonding before the at least two dice are secured together. Moreover, the asymmetrical die arrangement and coverage of the wire bonds of the lower die by the upper die may induce an irregular flow front of filled polymer as the assembly is encapsulated by transfer molding resulting in incomplete encapsulation without voids and increased probability of wire bond sweep and consequent shorting.

Therefore, it would be advantageous to develop a technique and device for increasing integrated circuit density in the form of a semiconductor device assembly using substantially similar or identically sized, LOC configured dice back bonded in a symmetrical package configuration and employing a symmetrical, multi-piece lead frame configuration readily susceptible to transfer molded packaging.

BRIEF SUMMARY OF THE INVENTION

The present invention relates to a method and apparatus for increasing the integrated circuit density of a semiconductor assembly, and in particular, a dual LOC semiconductor die assembly by stacking two LOC semiconductor dice back to back on opposing sides of a common base lead frame and extending lead fingers over the active surfaces of the dice for wire bonding to centrally located bond pads thereof.

In one embodiment, the present invention may include stacking a first die to a second die back to back with a base lead frame therebetween so that the active surfaces of the first and second dice are facing outward in substantially opposite directions. A first offset lead frame and second offset lead frame, each having a plurality of lead fingers, are attached to primary lead fingers of the base lead frame with the lead fingers of the offset lead frames configured to extend over the first and second die, respectively, in a cantilevered manner. The offset lead frame lead fingers may be electrically connected at inner ends thereof to bond pads of the die over which they extend, as by wire bonding, tape automated bonding or thermocompression bonding, while the outer ends of the lead fingers may be electrically connected to primary lead fingers of the base lead frame, as by spot welding, soldering or thermocompression bonding.

The semiconductor die assembly of the present invention may further include a dielectric packaging envelope which encapsulates the base lead frame with the primary lead fingers extending therebeyond, the first and second dice, the first and second lead offset frames and the lead finger connections to the bond pads and the primary lead fingers. The packaging may be effected by a transfer molding process which may be facilitated by the use of mutually superimposed dam bars of the first and second offset lead frames on opposing sides of dam bars of the base lead frame to prevent molten, filled polymer encapsulant from extruding out of the mold cavities placed over the first and second semiconductor dice between the primary lead fingers of the base lead frame. Following encapsulation, a trim and form operation is performed to remove excess portions of the offset lead frames as well as the dam bars and to separate the packages into individual dual LOC semiconductor die assemblies and appropriately configure outer ends of the primary lead fingers.

Accordingly, the LOC semiconductor assembly of the present invention increases integrated circuit density by providing a stacked first and second die in a back to back configuration with the base lead frame therebetween. By this opposing, stacked arrangement, the potential for electrical shorting between the first and second die is significantly reduced since the active surfaces of the first and second die are facing outwardly in opposite directions. Further, the first and second die are advantageously arranged with large back side surfaces in contact with the base lead frame so that heat generated by the dice during operation is effectively transferred to the base lead frame and then out of the package through the primary lead fingers. In addition, effective, void free transfer molding is facilitated by the symmetrical configuration. Finally and without limitation, initial attachment of both the first and second die in back to back relationship to a common lead frame in a symmetrical relationship facilitates manipulation of the assembly for attachment of the offset lead frames and wire bonding and reduces the potential for damage to the assembly.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 1(a)–1(h) are simplified cross-sectional views illustrating a method for making a preferred embodiment of a dual LOC semiconductor die assembly according to the present invention;

DETAILED DESCRIPTION OF THE INVENTION

A presently preferred embodiment of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same numerical designation.

Figure 1A:
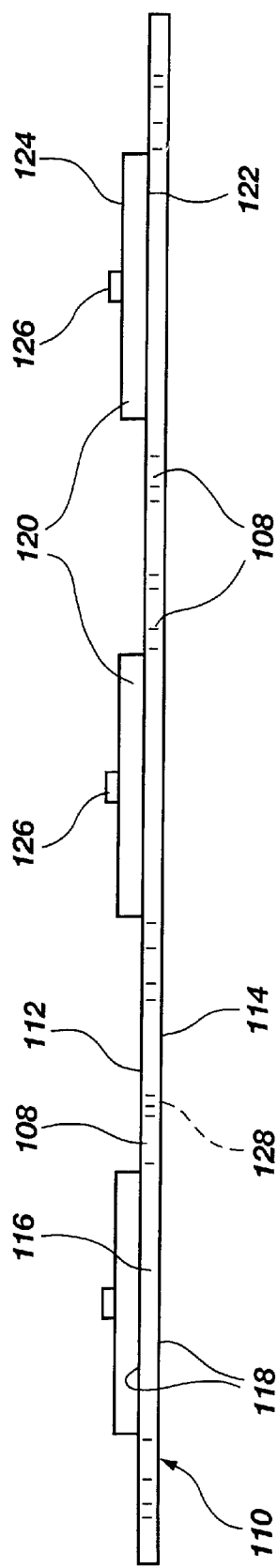
Figure 3:
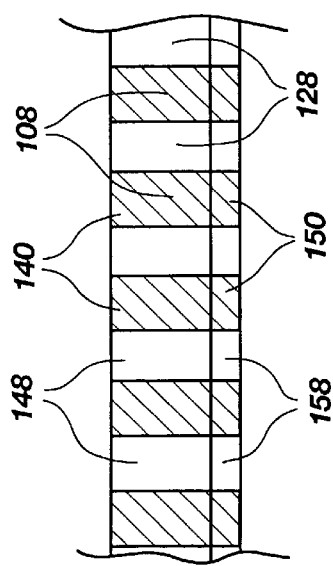
FIG. 3 is a partial cross-section side view taken along line 3—3 of FIG. 1(e), illustrating the alignment of the dice housing with the first and second lead offset frames, according to the present invention.
Figure 4:
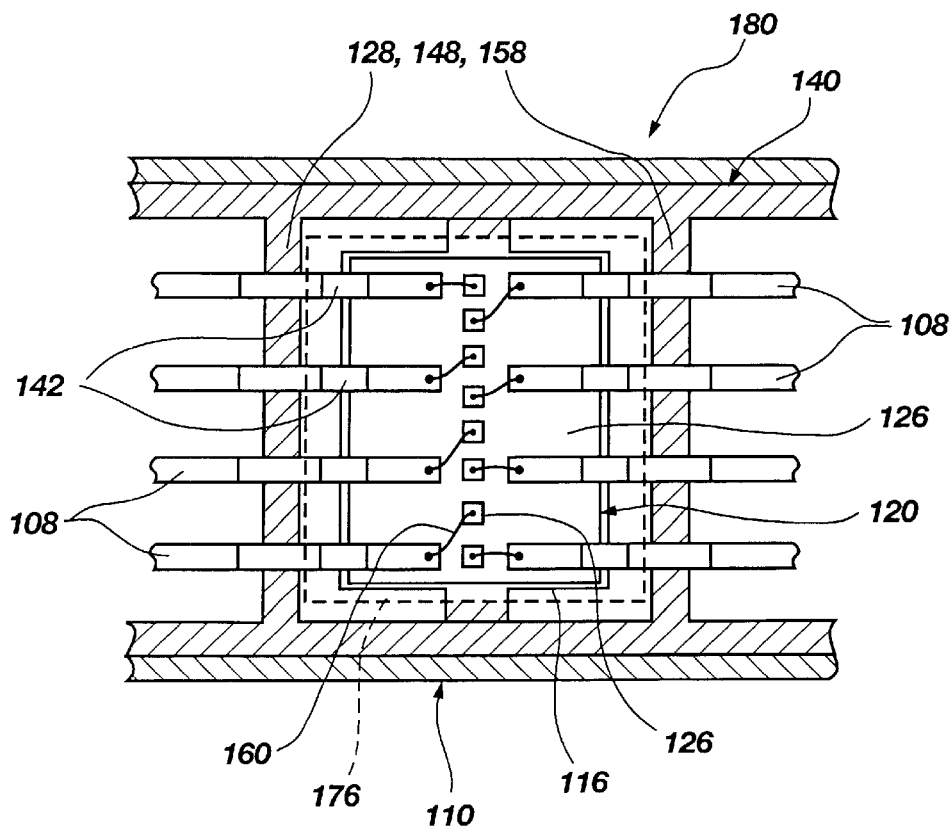
FIG. 4 is a top, schematic elevation of a semiconductor die assembly invention, depicting superimposition of a first offset lead frame of a strip of first offset lead frames with a base lead frame of a strip of base lead frames with a semiconductor die attached to the base lead frame and the lead fingers of the first offset lead frame wire bonded to bind pads of the die.

A method and apparatus of a presently preferred embodiment of the present invention is shown in FIGS. 1(a)–1(h), with occasional reference to FIGS. 3 and 4 as appropriate. FIG. 1(a) depicts a simplified cross-sectional view, as do FIGS. 1(b)–1(h), of a strip of base lead frames 110 in the process of having semiconductor dice attached and electrically connected thereto. It should be noted that spacing between adjacent base lead frames has been compressed in the drawing figures for clarity, but in actuality each base lead frame 110 includes primary lead fingers extending laterally a sufficient distance so as to provide adequate length for deformation thereof into desired shapes outside of packaging encapsulating the dice.

In particular, FIG. 1(a) illustrates a strip of base lead frames 110 each having a first side 112 and a second side 114 and a die attach site 116 with opposing die attach surfaces 118. Also, shown in dashed lines, base lead frame dam bars 128 may be provided integrally with primary lead fingers 108 of each base lead frame 110 and extending outwardly on at least two sides of each base lead frame 110 from adjacent each die attach site 116.

The base lead frame 110 can be made from any metallic material which exhibits desirable properties with respect to, for example, electrical conductivity, electrical resistivity, mechanical strength, and ductility. Well known examples of such materials include, without limitation, alloy 42, copper and aluminum As shown in FIG. 1(a), a plurality of first dice 120 are attached to corresponding die attach surfaces 118 of die attach sites 116 on the first sides 112 of the base lead frames 110, as by conventional die pick and place equipment. Each first die 120 includes a back side 122 and an active surface 124 having substantially centrally located bond pads 126 in one or more rows or other arrangement on the active surface 124. The back side 122 of each first die 120 may be attached or secured by any means known in the art to the die attach surfaces of the first side 112 of the base lead frame 110. Examples of known attaching or securing materials include non-conductive adhesive, conductive adhesive, dual sided adhesive tape, silver solder, polyimide, or any other suitable means of bonding known in the art. With such attachment approach, the active surface 124 of each first die 120 faces outwardly away from the dice housing 110 on first side 112.

Figure 1B:
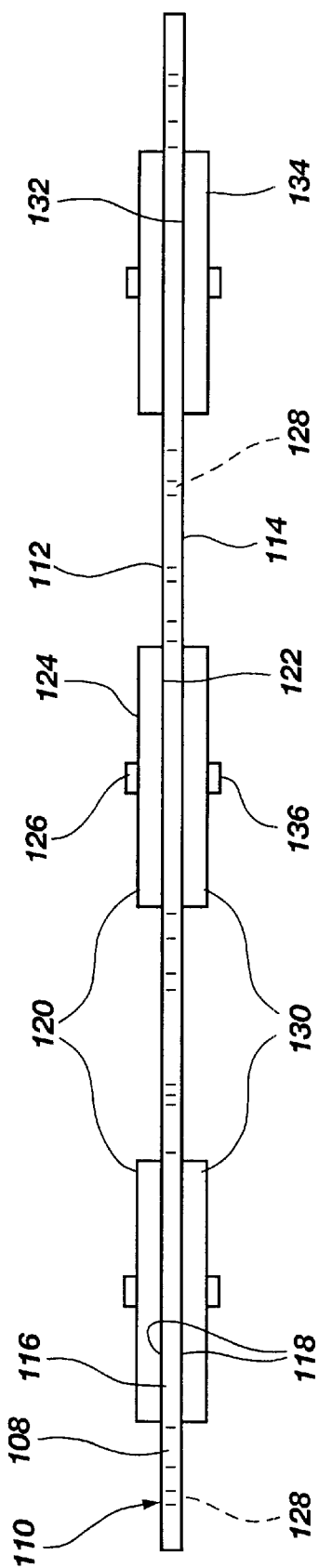

As shown in FIG. 1(b), a plurality of second dice 130 are attached to corresponding die attach surfaces 118 of die attach sites 116 on the second side 114 of the base lead frame 110. Each of the second dice 130 may be, but are not limited to, the same dimensions and the same type and configuration of semiconductor die the first dice 120. Each of the second dice 130 includes a back side 132 and an active surface 134 having substantially centrally located bond pads 136 in one or more rows or other configuration on the active surface 134. The back sides 132 are therefore attached or secured by any known means in the art to the die attach surfaces 118 on the second side 114 of the base lead frame 110 in similar fashion to that employed for the first dice 1290, as previously described. In practice, the base lead frame is inverted so that second side 114 of base lead frame is facing upwardly for placement of second dice 130 on die attach surfaces by the same or similar conventional die pick and place equipment as was used to place first dice 120. Thus, first dice 120 are stacked, each with a corresponding second die 130 on the opposite die attach surface of a die attach site in back to back fashion (back surface 122 facing back surface 132) and with the base lead frame 110 therebetween.

As shown in FIG. 1(c), a strip of first offset lead frame 140 is provided for attaching to the base lead frames 110. The first offset lead frames 140 include lead fingers 142 having inner ends 146 such that the first offset lead frames are of sufficient size and configured in relation to the base lead frames 110 and the first dice 120 attached thereon with lead fingers 142 preferably bent as shown to exhibit a cantilevered position over each first die 120. The lead fingers 142 of the first offset lead frames 140 also include lead frame attach sites 144 at lower surfaces thereof for attachment to primary lead fingers 108 of the base lead frames 110.

Also, as shown in dashed lines, the first offset lead frames 140 include first dam bars 148 extending substantially transversely between adjacent lead fingers 142, as described in further detail with respect to FIGS. 3 and 4 hereafter. The first offset lead frames 140 are positioned to align with first dice 120 on base lead frames 110 so that lead frame attach sites 144 of lead fingers 142 are disposed over portions of the primary lead fingers 108 of base lead frames 110 on opposing each of the first die 120 and, further, so that the first dam bars 148 are aligned with (vertically superimposed on) the dam bars 128 of base lead frames 110. First offset lead frames 140 may be made from any metallic material, the same materials as previously disclosed for base lead frames 110 being suitable.

Next, and as shown in FIG. 1(d), at least the lead fingers 142 of the first offset lead frames 140 are attached at attach sites 144 to the underlying primary lead fingers 108 of base lead frames 110 adjacent to each of the first die 120 so that each first dam bar 148 is aligned with and stacked on a corresponding base lead frame dam bar 128 (see FIGS. 3 and 4). Attaching the first offset lead frames 140 to the base lead frames 110 may be accomplished by, but is not limited to, any suitable welding or bonding process known in the art, such as, for example, spot welding, thermocompression bonding, soldering, or conductive adhesive bonding. As desired, the first offset lead frames 140 may be attached to the base lead frames 110 substantially along the entire lengths of the superimposed dam bars 148 and 128.

Figure 1E:
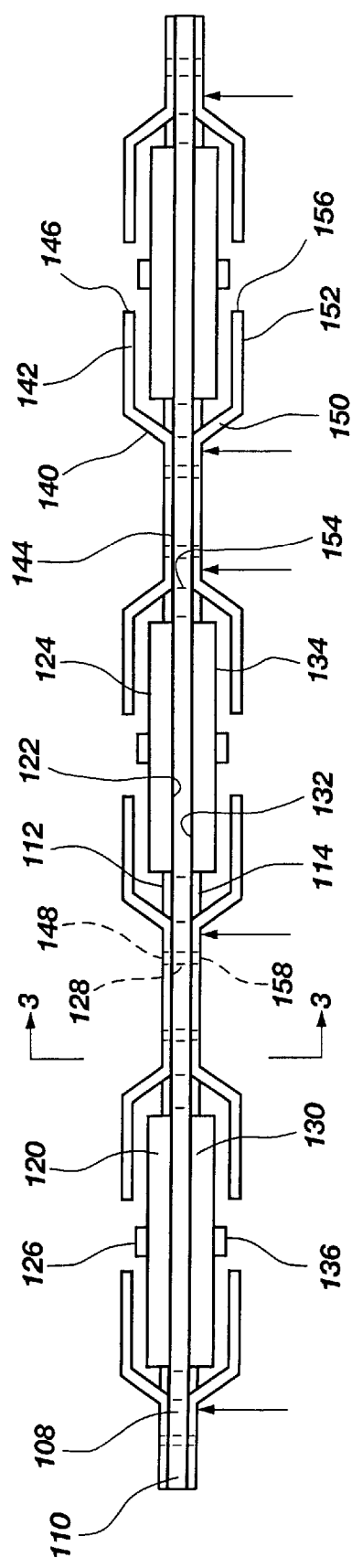

As shown in FIG. 1(e), a strip of second lead offset frames 150, similar to the strip of first offset lead frames 140, is attached to the second side 114 of the dice housing 110. Essentially, attachment may be accomplished employing the same or a similar fashion for the second offset lead frames 150 as that described in conjunction with FIGS. 1(c) and 1(d) for the first offset lead frames 140. The second offset lead frames 150 are positioned in superimposition with the first offset lead frames 140 so that second lead frame attach sites 154 of lead fingers 152 of second offset lead frames 150 are secured to the primary lead fingers 108 on the second side 114 of base lead frame 110 and with second dam bars 158 correspondingly aligned with the base lead frame dam bars 128. Attaching the second offset lead frames 150 to the base lead frames 110 may be accomplished by any of the techniques previously discussed with respect to attachment of the first offset lead frames. In practice, the assembly will be oriented with second dice 130 facing upwardly, so that the strip of second offset lead frames 150 may be placed over the second dice and welding or other bonding equipment will have ready access to second offset lead frames 150 to effectuate bonding thereof to base lead frame 110 at second lead frame attach sites 154.

To better illustrate the alignment of the assembly's base lead frame 110 with the first and second offset lead frames 140 and 150, FIG. 3 is taken along line 3—3 in FIG. 1(e) to depict a partial cross-sectional side view thereof. As shown in FIG. 3, the first and second offset lead frames 140 and 150 are stacked and aligned with the base lead frame 110 in a bottom-to-bottom fashion with the first and second dam bars 148 and 158 aligned in a stack with the dice housing dam bar 128.

Figure 1F:
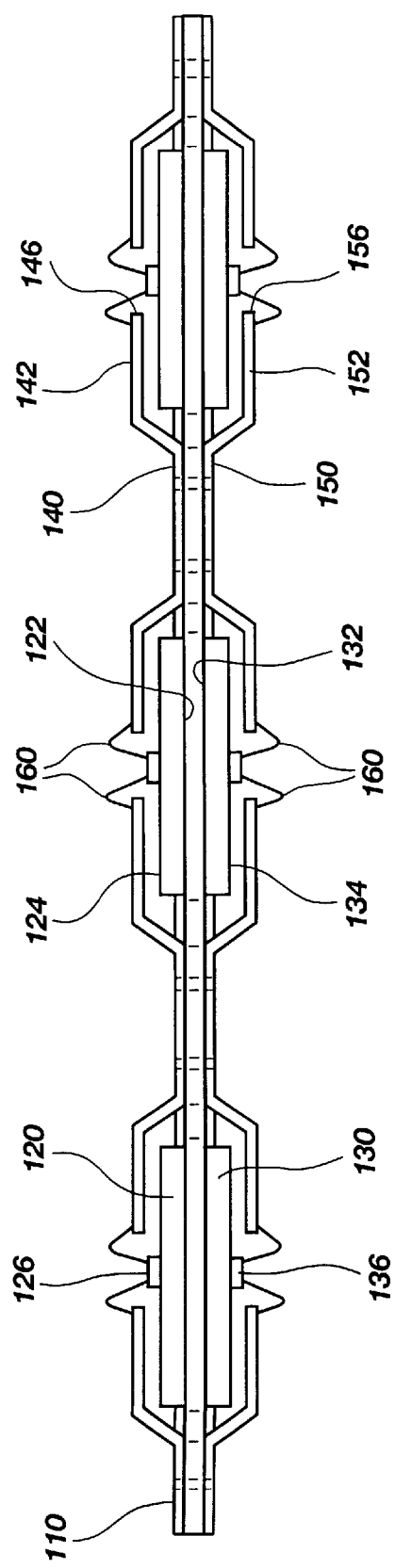

Next, as shown in FIG. 1(f), wire bonds 160 of gold, aluminum or suitable alloys thereof may be formed by any suitable wire bonding technique between the lead ends 146 of the lead fingers 142 of first lead frames 140 and corresponding bond pads 126 on each of the first dice 120 for electrical interconnection therebetween. For example, suitable means for wire bonding may include ultrasonic bonding, thermocompression bonding, and/or thermosonic bonding. The same process may then be employed with the second lead frame 150, in which wire bonds 160 may be attached between the lead ends 156 of lead fingers 154 of the second offset lead frames 150 and corresponding bond pads 136 of each of the second dice 130. Before forming such wire bonds 160 with respect to the second lead frames 150, the base lead frame 110 may desirably be oriented with second offset lead frames 150 on top of the assembly to provide easier equipment accessibility for wire bonding.

It should be noted that the above wire bonds 160 comprise conductive elements providing electrical interconnection between semiconductor die bond pads and lead ends of the lead fingers. Other suitable structures than wire bonds may also be used as a conductive element for such electrical interconnection. For example, tape automated bonding (TAB) may be employed or, if lead fingers of the offset lead frames are suitably elongated and oriented so as to extend over bond pads of the dice, thermocompression bonding therebetween may be employed.

Figure 1G:
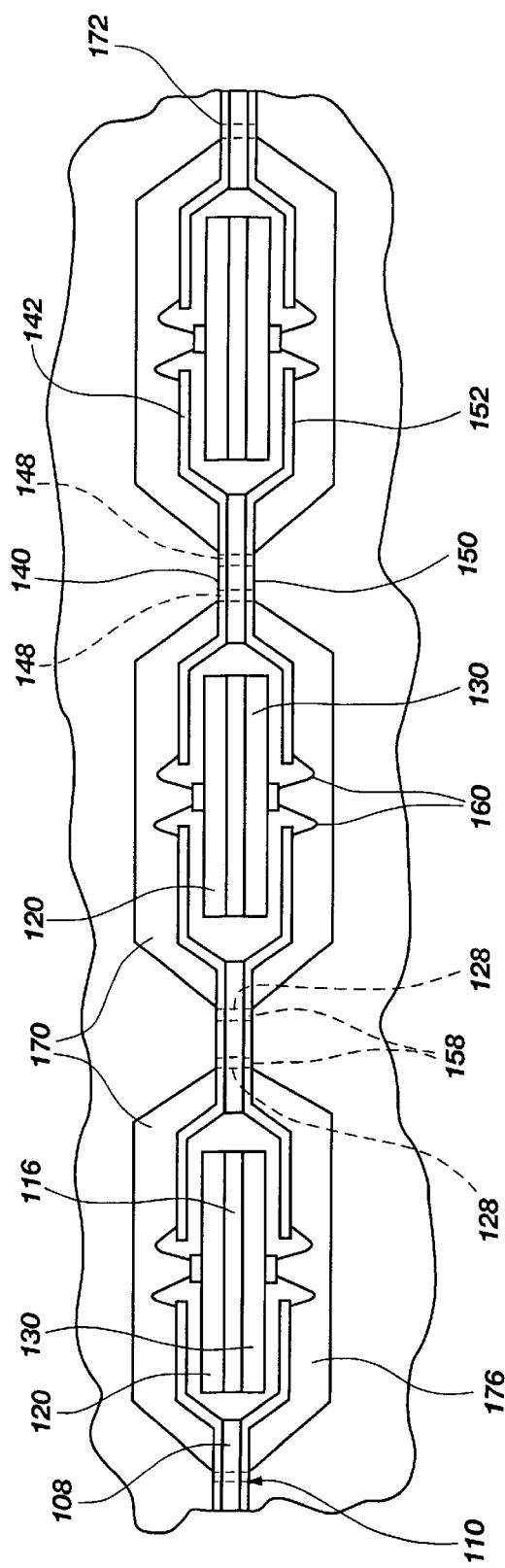

Upon fabrication of the previously described assembly of a strip of base. lead frames 110 with attached semiconductor dice 120 and 130, first and second offset lead frames 140 and 150, and wire bonding completed, the assembly is preferably encapsulated for protection from physical damage and environmental contamination. The encapsulation process used may be any suitable known encapsulation process and preferably comprises a transfer molding process as known in the art. As shown in FIG. 1(g), a transfer mold having a plurality of die cavities 170 is placed over each of the dual LOC semiconductor assemblies on the strip of base lead frames 110, each semiconductor assembly including a first and second die 120 and 130 and a common base lead frame 110. The transfer molding process encapsulates the central portion of each base lead frame 110 including die attach site 116, lead fingers 142 and 152 of first and second offset lead frames 140 and 150, first and second dice 120 and 130 and the wire bonds 160 in an encapsulant package 176. The encapsulant preferably comprises, but is not limited to, a particulate-filled, thermosetting polymer.

As shown in FIG. 3, the dam bars 148 and 158 described previously. extend substantially transversely between the lead fingers 142 and 152 of the superimposed first and second offset lead frames 40 and 150, respectively, in alignment with the dam bars 128 of the base lead frame 110 extending substantially transversely between primary lead fingers 108. As is well known in the art with respect to single lead frames, dam bars provide a "dam" for preventing the heated, molten, filled polymer. encapsulant material of the transfer molding process from escaping from between the cavities 170 of the transfer mold between adjacent but laterally spaced lead fingers where the mold halves clamp together as at 172. However, the combination or stack of dam bars 128, 148 and 158 as described previously are configured and collocated to prevent the heated, molten encapsulant material from escaping through a much higher gap necessitated by the use of three superimposed lead frames 110, 140 and 150.

Figure 1H:
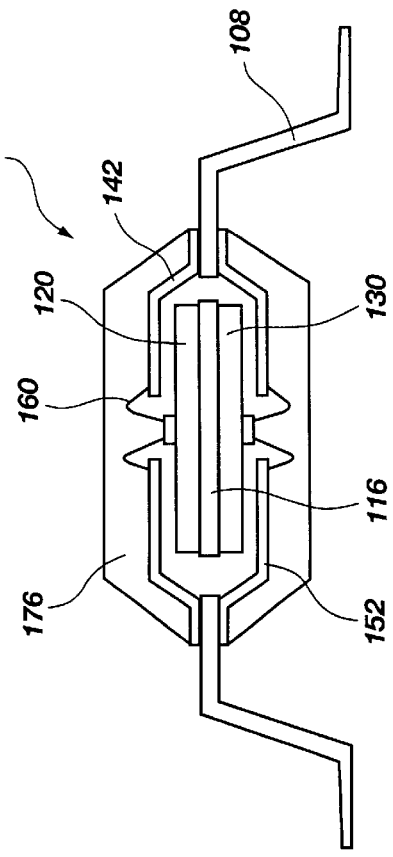

As shown in FIG. 1(h), a trim and form operation is completed on the assembly to separate each stacked first and second die 120 and 130 with their associated lead frames 110, 140 and 150 into individual dual LOC semiconductor die assemblies 180. In particular, the trim operation is accomplished in pertinent part by shearing the segments of the dice housing dam bar 128 and of first and second dam bars 148 and 158 lying between superimposed lead fingers 108, 142 and 152 from the base lead frame 110 and first and second offset lead frames 140 and 150, respectively. The base lead frames 110 are also shorn from their strip to provide individual and separate dual LOC semiconductor assemblies 180. The primary lead fingers 108 of each base lead frame 110 protruding from the encapsulant package may then be configured in any desired configuration such as a down and then laterally outward direction, as shown in FIG. 1(h). As such, it should be noted that the trim and form operation employed may be accomplished by any conventional method or process known in the art.

Figure 2:
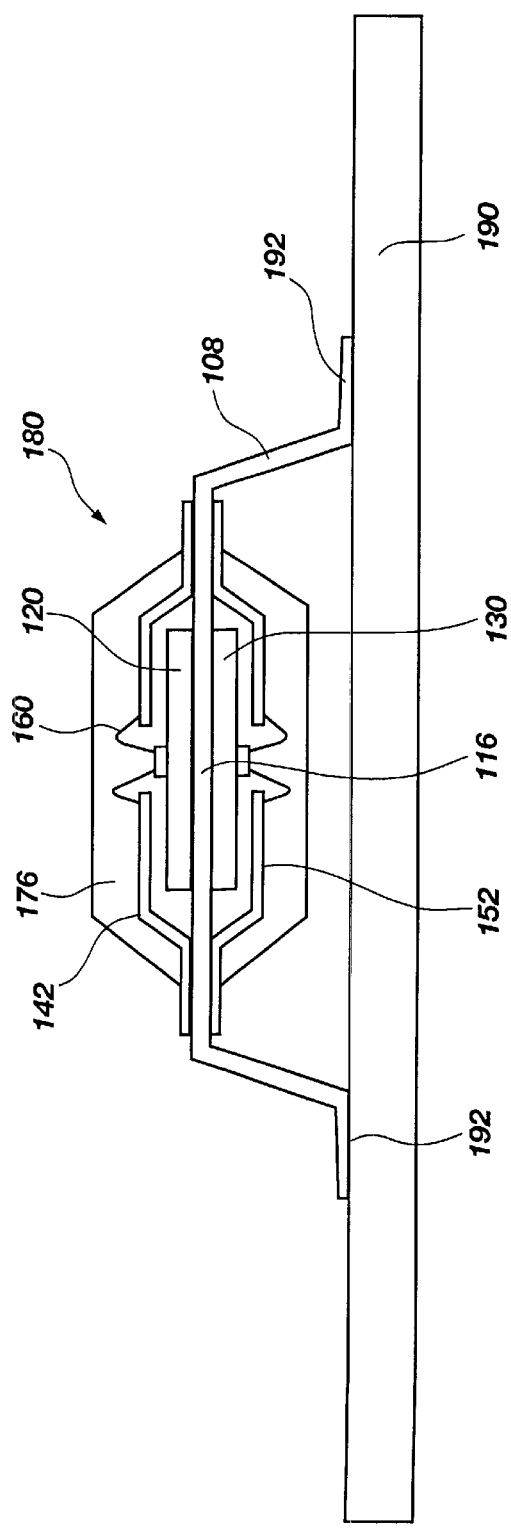
FIG. 2 is a simplified cross-sectional view, illustrating a preferred embodiment of a packaged, dual LOC semiconductor die assembly according to the present invention attached to a carrier substrate.

As shown in FIG. 2, the dual LOC semiconductor die assembly 180 of the present invention may then be mounted to circuit traces 192 of a carrier substrate 190. The carrier substrate 190 may be any suitable higher level packaging, such as an interposer or printed circuit board, for supporting and electrically interconnecting the dual LOC semiconductor die assembly 180 to external circuitry. As depicted in FIG. 2, the ends of lead fingers 142 and 152 may optionally extend beyond the side periphery of packaging material 176 in superimposition with primary lead fingers 108 to provide reinforcement thereof adjacent the latters' exit points from packaging material 176.

In the event that the manner of alignment, superimposition and assembly of base lead frame 110 and first and second offset lead frames 140 and 150, respectively, requires further clarification, FIG. 4 of the drawings is a top elevation of a semiconductor die assembly 180 according to the invention after encapsulation but before excess portions of the lead frame strips carrying lead frames 110, 140 and 150 have been trimmed away. It is noted that second die 130 and second offset lead frame 150 are hidden under die attach site 116 of base lead frame 110 in this view. The lateral periphery of encapsulant material 176 packaging the assembly 180 is shown in a short-dashed line, while portions of the lead frames 110 and 140 to be cut away during a trim and form operation are shaded and bordered by longer dashes. Of course, second offset lead frame 150 will be cut away along the same lines, the superimposed dam bars 128, 148 and 158 between the laterally spaced lead fingers being cut away after encapsulation as no longer needed and to electrically isolate laterally adjacent primary lead. fingers 108 (and, of course, superimposed and attached lead fingers 142 and 152 electrically connected to bond pads 126 and 136) from one another.

Figure 5:
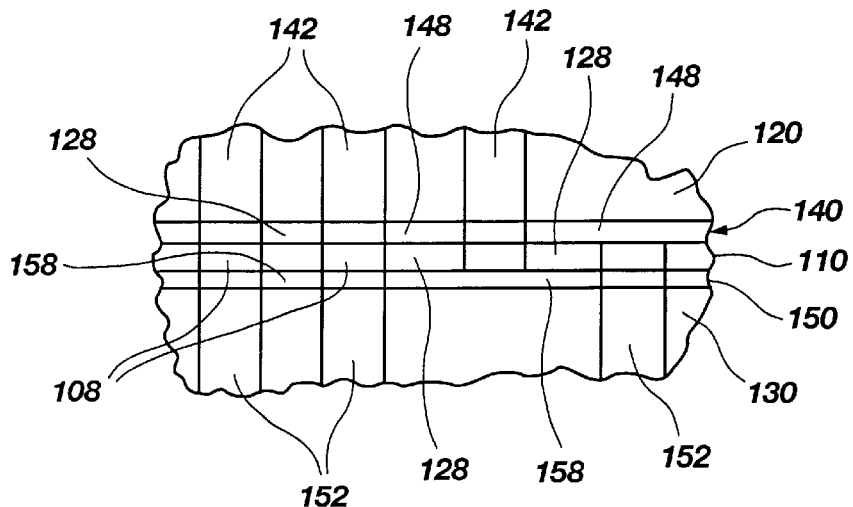
FIG. 5 is an enlarged side elevation of a semiconductor die assembly according to the present invention wherein some offset lead fingers of different offset lead frames may be connected to different primary lead fingers while other offset lead fingers of different offset lead frames may be connected to the same primary lead fingers.

It should also be noted that semiconductor dice 120 and 130 may not necessarily be identical and have different numbers and arrangements of bond pads thereon. In such an instance, each offset lead frame 140 and 150 may be differently configured with different numbers, lengths and orientations of respective lead fingers 142 and 152. The two semiconductor dice 120 and 130 of the assembly may share some, but not all, inputs and outputs and so staggered lateral spacing of lead fingers may be used to attach one lead finger 142, for example, to a primary lead finger 108 without attaching a lead finger 152 thereto. The use of the dam bars 128, 148 and 158 facilitates this approach, as the dam bars provide the encapsulant dam but then are trimmed away for electrical isolation of the lead fingers. FIG. 5 illustrates this approach, looking toward a semiconductor die assembly 180 according to the invention from the side, wherein some primary lead fingers 110 are attached only to a first offset lead finger 142, some primary lead fingers 110 are attached to only to a second offset lead finger 152, and some primary lead fingers are attached to both a lead finger 142 and a lead finger 152. The segments of dam bars 128, 148 and 158 extending between the lead fingers are, as noted, removed after encapsulation of the assembly.

The dual LOC semiconductor die assembly of the present invention may be embodied as two identical semiconductor dice, or may comprise two different types or functions of semiconductor dice which operate in combination, the invention increasing the efficiency of the combination and rendering it more compact for placement on a carrier substrate. The present invention has particular utility for applications, such as the aforementioned identical semiconductor dice embodied as memory dice, which memory dice may share common inputs and outputs, this being facilitated by the attachment of lead fingers of the first and second offset lead frames to opposing sides of primary lead fingers of the base lead frame.

It can be well appreciated by those of ordinary skill in the art that the dual LOC semiconductor die assembly 180 of the present invention provides a substantially symmetrical, outwardly facing stacked LOC configured semiconductor die arrangement employing floating or cantilevered lead fingers that facilitate wire bonds of limited length and permit flexure of the lead fingers during transfer molding. Such flexure accommodates ready passage of an encapsulant flow front and reduce any tendency for silicon particles employed as a filler in the encapsulant polymer to become wedged between a lead finger and a passivation layer over a die's active surface and penetrate the latter, as in conventional LOC die configurations. Moreover, the substantially symmetrical configuration of the outwardly facing dice of dual LOC semiconductor die assembly of the invention promotes even passage of the encapsulant flow front and avoids partially closed or confined areas which in prior art designs may result in internal voids giving rise to the so-called "popcorn"

effect of dice exploding when heat-tested. In addition, the attachment of lead fingers of the first and second offset lead frames to the base lead frame outside the peripheries of the first and second semiconductor dice and the avoidance of physical attachment of the lead fingers to the active surfaces of the semiconductor dice reduces the potential for damage to the dice and compromising of the passivation layer over the active surface. Further, the present invention may provide superior heat dissipation qualities, in which the back to back arrangement of dice bonded to a common die attach site may be used to channel to the base lead frame and then outwardly therethrough to an external surface of the encapsulant package. In addition, the substantial mirroring of the two sides of the assembly promotes speedy and efficient fabrication techniques through the ability to perform the same steps on both sides of the assembly by merely inverting the strip of base lead frames being assembled with dice and offset lead frames, and wire bonded. This advantage obtains whether or not the first and second die are identical, or even perform the same function. Furthermore, since the first and second dice are mounted back to back on a common base lead frame, the overall height of the stacked dual LOC semiconductor die assembly of the present invention is minimized. It should also be noted that supporting the dice from their back sides also permits the use of dice thinned by back grinding (for example, to 8 mils or less) to further reduce package thickness, as the die attach site of the base lead frame provides mechanical support for the die in a manner similar to that of a conventional die paddle, but without the disadvantages of conventional lead frames.

While the present invention has been disclosed in terms of an exemplary embodiment and variations thereof, those of ordinary skill in the art will recognize and appreciate that the invention is not so limited. Those of ordinary skill in the art will recognize and appreciate that many additions, deletions and modifications to the disclosed embodiment and its variations may be implemented without departing from the scope of the invention, which is limited only by the appended claims and their legal equivalents.

What is claimed is:

1. A semiconductor die assembly, comprising:
    a base lead frame having a die attach site with a first surface and a second, opposing surface and a plurality of primary lead fingers extending away from the die attach site;
    a first semiconductor die and a second semiconductor die, each configured with an active surface having a plurality of substantially centrally located bond pads thereon and respectively attached by back sides opposite the active surfaces to the first and second opposing surfaces of the die attach site;
    a first offset lead frame including a plurality of lead fingers extending over the first semiconductor die to locations proximate bond pads thereof from locations of attachment to associated primary lead fingers, the first offset lead frame lead fingers being electrically connected to the bond pads of the first semiconductor die;
    a second offset lead frame including a plurality of lead fingers extending over the second semiconductor die to locations proximate bond pads thereof from locations of attachment to associated primary lead fingers, the second offset lead frame lead fingers being electrically connected to the bond pads of the second semiconductor die; and
    an envelope of dielectric package material encapsulating the first and second semiconductor dice, the lead fingers extending respectively thereover and the die attach site, and wherein outer portions of at least the primary lead fingers protrude from the envelope of dielectric package material;
    wherein the lead fingers of the first offset lead frame and the second offset lead frame are respectively cantilevered over the first and second semiconductor dice; and
    wherein the cantilevered lead fingers of the first offset lead frame and the second offset lead frame are encapsulated by the envelope of dielectric package material from the locations of attachment to associated primary lead fingers to end portions thereof.

2. The semiconductor die assembly of claim 1, wherein locations of attachment of lead fingers of the first and second offset lead frames to primary lead fingers lie within the envelope of dielectric package material.

3. The semiconductor die assembly of claim 1, wherein the primary lead fingers extend away from the die attach site on opposing sides thereof.

4. The semiconductor die assembly of claim 1, wherein at least some lead fingers of the first offset lead frame and at least some lead fingers of the second offset lead frame are attached to a common primary lead finger.

5. The semiconductor die assembly of claim 1, wherein the first semiconductor die and the second semiconductor die are identical.

6. The semiconductor die assembly of claim 5, wherein each lead finger of the first offset lead frame is attached to a first side of a primary lead finger and each lead finger of the second offset lead frame is attached to a second, opposing side of a primary lead finger to which a lead finger of the first offset lead frame is attached.

7. The semiconductor die assembly of claim 6, wherein the identical first and second semiconductor dice comprise identical memory dice of substantially equal memory capacity.

8. The semiconductor die assembly of claim 1, wherein the primary lead fingers extend away from the die attach site on opposing sides thereof.

9. The semiconductor die assembly of claim 1, wherein at least some lead fingers of the first offset lead frame and at least some lead fingers of the second offset lead frame are attached to a common primary lead finger.

10. The semiconductor die assembly of claim 1, wherein the first semiconductor die and the second semiconductor die are identical.

11. The semiconductor die assembly of claim 10, wherein each lead finger of the first offset lead frame is attached to a first side of a primary lead finger and each lead finger of the second offset lead frame is attached to a second, opposing side of a primary lead finger to which a lead finger of the first offset lead frame is attached.

12. The semiconductor die assembly of claim 11, wherein the identical first and second semiconductor dice comprise identical memory dice of substantially equal memory capacity.

13. A semiconductor assembly comprising:
    at least a first die and a second die stacked back to back with a common base lead frame disposed therebetween;
    a first lead frame and a second lead frame attached to the common base lead frame, the first lead frame and the second lead frame each having lead fingers respectively extending from points of attachment to lead fingers of the common base lead frame over active surfaces of the first die and the second die and electrically connected to bond pads of the respective first and second dice; and
    a dielectric material encapsulating the first die and the second die, a portion of the common base lead frame lying therebetween, the first lead frame and the second lead frame, and inner ends of the lead fingers of the common base lead frame;

wherein the lead fingers of the first lead frame and the second lead frame respectively extend over the active surfaces of the first die and the second die in a cantilevered manner; and wherein the cantilevered lead fingers of the first lead frame and the second lead frame are encapsulated by the dielectric material from the points of attachment to the lead fingers of the common base lead frame to end portions thereof.

14. A semiconductor die assembly in process, comprising:

a base lead frame having two semiconductor dice mounted thereto and a plurality of lead fingers; and first and second offset lead frames, each having a plurality of lead fingers attached to primary lead fingers of the base lead frame and extending over one of the two semiconductor dice;

wherein the lead fingers of the first lead frame and the second lead frame respectively extend over the active surfaces of the first die and the second die in a cantilevered manner; and wherein each lead frame includes at least one dam bar extending between a plurality of lead fingers of that respective lead frame, and wherein at least a portion of at least one dam bar of each lead frame is superimposed with at least a portion of at least one dam bar of the other lead frames.

* * * * *

UNITED STATES PATENT AND TRADEMARK OFFICE
CERTIFICATE OF CORRECTION

PATENT NO.        : 6,541,846 B2                                         Page 1 of 1
APPLICATION NO.   : 09/767446
DATED             : April 1, 2003
INVENTOR(S)       : Venkateshwaran Vaiyapuri It is certified that error appears in the above-identified patent and that said Letters Patent is hereby corrected as shown below:

In the specification:

| | | |
|---|---|---|
| COLUMN 1, | LINE 23, | change " "real estate"," to --"real estate,"-- |
| COLUMN 4, | LINE 2, | change "assembly invention," to --assembly according to the invention,-- |
| COLUMN 4, | LINE 52, | change "alloy 42," to --alloy 42, -- |
| COLUMN 4, | LINE 53, | change "and aluminum" to --and aluminum.-- |
| COLUMN 5, | LINE 67, | change "dice housing 110." to --base lead frame 110.-- |
| COLUMN 6, | LINE 28, | change "dice housing" to --base lead frame-- |
| COLUMN 6, | LINE 33, | change "first lead" to --first offset lead-- |
| COLUMN 6, | LINE 40, | change "lead fingers 154" to --lead fingers 152-- |
| COLUMN 6, | LINE 58, | change "of base. lead" to --of base lead-- |
| COLUMN 7, | LINE 11, | change "previously. extend" to --previously extend-- |
| COLUMN 7, | LINE 13, | change "frames 40" to --frames 140-- |
| COLUMN 7, | LINE 18, | change "polymer. encapsulant" to --polymer encapsulant-- |
| COLUMN 8, | LINE 10, | change "lead. fingers" to --lead fingers-- |
| COLUMN 8, | LINE 15, | change "dice 1290," to --dice 120,-- |
| COLUMN 8, | LINE 30, | change "lead fingers 110' to --lead fingers 108-- |

Signed and Sealed this

Fifth Day of June, 2007

JON W. DUDAS
*Director of the United States Patent and Trademark Office*